(12) United States Patent
Chu et al.

(10) Patent No.: US 6,425,497 B1
(45) Date of Patent: Jul. 30, 2002

(54) METHOD AND APPARATUS FOR DISPENSING RESIST SOLUTION

(75) Inventors: Yiau-Yi Chu, Hsinchu; Jen-Sen Huang, Miaoli; Shih-Hung Lu, Hsin-Chu; Tzung-Chi Fu, Miaoli, all of (TW)

(73) Assignee: Taiwan Semiconductor Manufacturing Co., Ltd., Hsin Chu (TW)

(*) Notice: Subject to any disclaimer, the term of this patent is extended or adjusted under 35 U.S.C. 154(b) by 0 days.

(21) Appl. No.: 09/812,735

(22) Filed: Mar. 20, 2001

(51) Int. Cl.$^7$ ................................................. B67D 5/08
(52) U.S. Cl. ........................................... 222/64; 222/61
(58) Field of Search ............................. 222/61, 64, 66, 222/1, 52

(56) References Cited

U.S. PATENT DOCUMENTS

| | | | | |
|---|---|---|---|---|
| 3,636,360 A | * | 1/1972 | Oishi et al. ............... | 250/218 |
| 3,864,044 A | * | 2/1975 | Lyshkow ................... | 356/201 |
| 4,344,429 A | * | 8/1982 | Gupton et al. ............ | 128/214 R |
| 4,637,813 A | * | 1/1987 | DeVries ..................... | 604/16 |

* cited by examiner

Primary Examiner—William C. Doerrler
Assistant Examiner—M A Cartagena
(74) Attorney, Agent, or Firm—Randy W. Tung

(57) ABSTRACT

A method and apparatus for dispensing a resist solution used in a semiconductor device manufacturing process senses the presence of air bubbles in the solution during delivery through a line feeding a dispensing pump. Air bubbles in the line are sensed by an optical photocoupler that senses changes in the intensity of light refracted through the solution caused by air bubbles entrapped in the solution. The sensor produces an air bubble indicating signal that can be used to activate an alarm or to stop the dispensing process.

18 Claims, 2 Drawing Sheets

METHOD AND APPARATUS FOR DISPENSING RESIST SOLUTION

TECHNICAL FIELD

The present invention broadly relates to semiconductor device manufacturing equipment, and deals more particularly with a method and apparatus for dispensing a solution of photoresist used in the manufacturing process.

BACKGROUND OF THE INVENTION

In processes for producing semiconductor devices from a semiconductor wafer, a number of techniques have been developed in order to form circuit patterns on the wafer. One of these processes employs photolithography which defines the circuit features on a wafer according to a specified pattern or mask. Subsequent manufacturing steps that are used to form a device include chemical and physical film depositions, etching, ion implantation, diffusion, annealing or thermal oxidation. Many of these processes require that a pattern of photoresist first be formed on the wafer substrate. The process for patterning the photoresist is referred to a photolithography process, which implies first depositing a uniform layer of photoresist onto the substrate, next exposing the photoresist layer to optical illumination through the mask, and then developing the exposed photoresist layer. The resist may be positive or negative, depending upon if it is to be removed or remain after the development of the irradiated regions. The development step may be carried out using wet chemical etching, dry plasma etching or by conversion to a volatile compound through the exposure radiation itself. The exposure radiation may be in the form of visible, deep ultraviolet or x-ray photons, or electron or ion beams of particles. The exposure can be made by a parallel process such as contact or projection printing from a mask, or by serially scanning one or more beams.

Prior to the application of the resist, the wafer surface must be cleaned, dehydrated and primed in order to improve the adhesion between the resist and the substrate. Cleaning steps are required because of the inevitable contamination which occurs during storage and handling between processing steps. As the minimum size of the circuit features is reduced, particles with diameters down to 10 nm and less have to be detected. Depending upon the expected contamination type and level, even chemical or dry cleaning will be required. Following surface cleaning, a dehydration bake is performed to evaporate most of the absorbed water. Once the wafer surface has been cleaned, a predetermined amount of resist is dispensed onto the wafer surface, either as the wafer remains motionless or is slowly rotated. Then, using a technique known as spin coating, the wafer is rapidly accelerated to a speed ranging between 2000 and 6000 RPM's. The acceleration stage is crucial to obtaining good uniformity since the solvents within the photoresist begin evaporating from the photoresist immediately after dispensing. After about 30 seconds of spin time, less than one percent of the originally dispensed amount of resist remains on the wafer surface, with the remainder having flown off with the spinning process. The typical resist thickness range is from 0.05–1.5 microns, and may not vary more than plus or minus 5 nm across a flat wafer, and plus or minus 10 nm from wafer to wafer. At this stage, the resist has a tacky consistency since less than $\frac{1}{3}$ of the solvent remains.

Dispensing systems typically include a reservoir of the resist solution coupled with a pump that pumps the solution from the reservoir to a nozzle where a discrete quantity is dispensed onto the wafer surface. The composition of the resist solution is such that air bubbles may become entrapped therein as the solution is pumped from the reservoir, through the pump to the dispensing nozzle. The introduction of air bubbles into the solution can result in an incorrect amount of the solution being dispensed, and can also result in the deposit of resist on the wafer containing these air bubbles. In either case, the dispensing of an incorrect amount of the resist or dispensing resist containing entrapped air bubbles can result in inconsistencies in the resist layer which in turn can cause defects in circuit features that cause malfunctions in the operation of a semiconductor device. Consequently, the presence of air bubbles in the solution increases the likelihood of scrap and therefore decreases process yield of good devices.

In an attempt to eliminate air bubbles from the resist solution prior to the dispensing process, prior dispensing systems have employed a trap tank coupled between the solution reservoir and the pump. This tank acts as a holding tank where the air bubbles are allowed to settle out and/or are drained off from the solution.

In addition to the problems discussed above, air bubbles can become introduced into the resist solution as a result of leaks in the piping system connecting the reservoir, tank trap and pump. Moreover, in the event that the reservoir runs empty, the pump sucks air into the feed lines for a period of time until solution is added to the reservoir. During this period, the pump effectively draws air into the lines which becomes mixed with the solution. In each of these events, in addition to reducing process yields, valuable processing time is lost because human intervention is necessary to correct the problem and in some cases, the entire processing operation must be suspended while operators flush the lines and refill them with a fresh resist solution.

It would therefore be desirable to provide a resist dispensing system that virtually eliminates the possibility of air bubbles becoming entrapped in the solution, and drawn through the dispensing pump. The present invention is directed toward solving this problem.

SUMMARY OF THE INVENTION

According to one aspect of the invention, apparatus is provided for dispensing a liquid resist solution used in a semiconductor device manufacturing process. The apparatus includes a reservoir of the resist solution, a trap tank for trapping air bubbles entrapped in the solution, a pump for drawing the resist solution from the tank to a dispensing nozzle, and a sensor for sensing the presence of air bubbles in the resist solution flowing from the tank trap to a dispensing nozzle and a sensor for sensing the presence of air bubbles in a resist solution flowing from the tank trap to the pump. A controller receives signals from the bubble sensor and controls the operation of the dispensing process. The sensor preferably comprises a light source for directing light through the resist solution, and a photosensitive detection element for detecting changes in the light passing through the resist solution and originating from the light source.

According to another aspect of the invention, apparatus is provided for use with a plurality of processing stations for processing semiconductor wafers which monitors the presence of air bubbles in resist solution drawn from a tank to a dispensing pump. The apparatus comprises a plurality of sensors for respectively detecting the presence of air bubbles in the resist solution drawn from the associated tank to the corresponding pump, wherein each of the sensors produces a signal indicative of the presence of air bubbles in the solution, and a circuit connected with each of the sensors for receiving the signals produced by the sensors and for generating an alarm signal then the circuit receives a signal from any one of the sensors. The circuit preferably includes a logic circuit having a plurality if inputs for receiving the sensor signals, and an output for delivering a trigger signal, and a switch actuated by the trigger signal for outputting the alarm signal.

According to still another aspect of the invention, a method is provided for dispensing liquid resist solution used in a process for manufacturing semiconductor wafer devices. The method includes the steps of flowing the solution from a reservoir into a tank; removing at least some of the air bubbles contained in the resist solution within the tank; flowing the solution from the tank through a line to a dispensing nozzle; sensing the presence of air bubbles contained in the solution flowing through the line; dispensing the solution through the nozzle; and, issuing an alarm when air bubbles are sensed. The sensing step is performed by passing light through the solution flowing through a line and sensing changes in the intensity of light passing through the solution. The changes in the light intensity being indicative of the presence of air bubbles in the solution.

Accordingly, it is a primary object of the present invention to provide a method and apparatus for dispensing resist solution onto a semiconductor wafer that increases process yield and decreases equipment down time.

Another object of the invention is to provide a method and apparatus as mentioned above that provides early detection of air bubbles entrapped within the solution before the solution enters a dispensing pump.

A still further object of the invention is to provide a method and apparatus as described above which employs an interlock circuit cooperating with process control equipment that interrupts the operation of the equipment when air bubbles in the resist solution are sensed, to thereby prevent the dispensing of resist solution containing air bubbles.

These, and further objects and advantages of the present invention will be made clear or will become apparent during the course of the following description of a preferred embodiment of the invention.

BRIEF DESCRIPTION OF THE DRAWINGS

In the drawings which form an integral part of the specification and are to be read in conjunction therewith, and in which like references numerals are employed to designate identical components in the various views.

DETAILED DESCRIPTION OF THE PREFERRED EMBODIMENT

Figure 1:
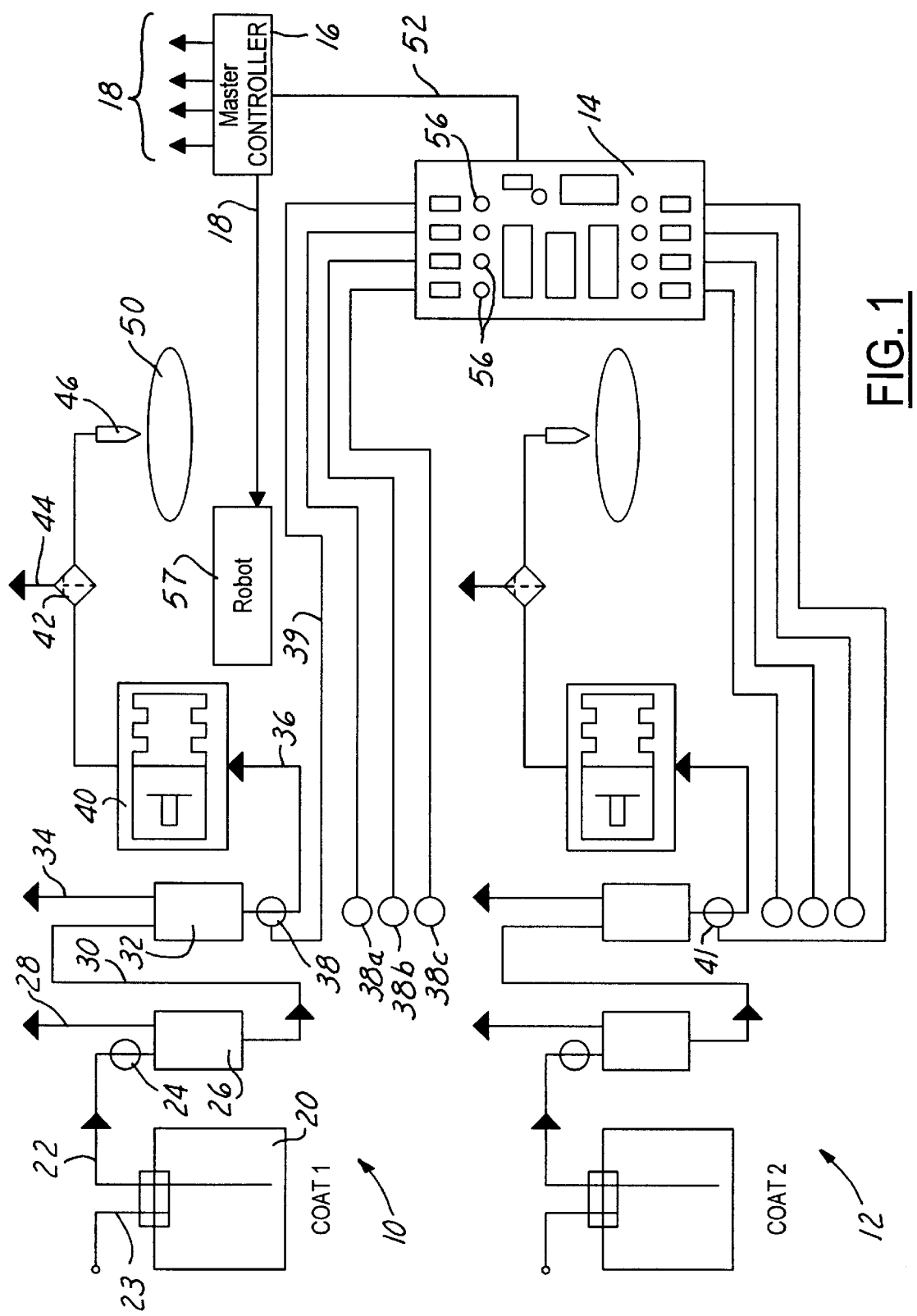
FIG. 1 is a combined block and schematic diagram of apparatus for dispensing resist solution at multiple processing stations in accordance with the preferred embodiment; and, FIG. 2 is a detailed schematic diagram of the control circuit and related sensors employed in the apparatus shown in FIG. 1.

Referring first to FIG. 1, the present invention generally relates to apparatus for dispensing a liquid resist solution from a nozzle 46 onto the surface of a semiconductor wafer 50 which is usually spinning during the dispensing process. Dispensing apparatus of this general type is part of a larger piece of equipment used in successively carrying out multiple manufacturing processes on a wafer 50, which typically includes a plurality of processing stations for simultaneously processing wafers 50. Two of the dispensing systems or "coaters" are generally shown by the numerals 10 and 12 which are respectively associated with two separate processing stations whose operation is controlled by a master controller 16. Coaters 10 and 12 are identical, consequently only the details of coater 10 will be described herein.

A quantity of the resist solution is contained in a source tank or bottle 20 which is pressurized by a line 23 so as to feed the solution through a line 22 into a holding tank 26. The bottle 20 and tank 26 thus act as a source or reservoir of the solution. A sensor 24 is employed to sense the presence of solution flowing through line 22 and is operated to generate a signal when solution in the line is no longer sensed. This signal acts as an alarm to alert an operator, or automatic controller, that the bottle 20 is empty or that it has otherwise malfunctioned. A vent line 28 is provided in tank 26 to allow the escape of air. The solution in the holding tank 20 flows through line 30 into a bubble trap tank 32 which is provided with an overflow drain 34. The trap tank 32 functions to trap micro air bubbles present in the resist solution which, if not removed from the solution, remain entrapped within the solution as it is dispensed onto the surface of the wafer 50. These micro air bubbles can cause imperfections in the layer of resist applied to the surface of the wafer 50. These imperfections later result in feature defects of the devices formed from the wafer 50, in turn causing the devices to be scraped.

A dispensing pump 40 draws solution from the trap tank 32 into the line 36 and delivers the solution to dispensing nozzle 46 through a filter 42 that is provided with a drain 44. The pump 40 is controlled by the master controller 16 which has a plurality of control outputs 18 for controlling other functions of the associated manufacturing station.

In spite of the use of the trap tank 32, some micro air bubbles may nevertheless remain entrapped in the solution and can be drawn into the pump 40. Moreover, any air leaks in the line 36 or related connections will result in air being drawn into the line and mixed with the solution to create additional micro air bubbles. Finally, on some occasions, the solution sensor 24 may malfunction in which case it is not possible to detect when the bottle 20 runs empty of resist solution. When the bottle 20 is empty, and tank 26 is likewise depleted, continuing operation of the pump 40 results in air being drawn through the lines into the pump which become mixed with the last remaining solution, thereby creating micro air bubbles. In accordance with the present invention, in order to obviate the problem discussed above, a bubble sensor 38 is provided for sensing the presence of micro air bubbles entrapped in the resist solution immediately before it enters the dispensing pump 40. Sensor 38 is mounted in the line 36 so as to sense bubbles flowing through the line. Although shown as being mounted near the trap tank 32, sensor 38 may also be mounted so a to sense micro air bubbles in the solution immediately before the solution enters the pump 40 through line 36. Bubble sensor 38 functions to sense changes in the intensity of light refracted through solution flowing through line 36. The presence of air bubbles in the solution alters the light refraction, thereby causing the intensity of the refracted light to change in proportion to the density of the micro air bubbles present. When the sensor 38 detects a change in the refracted light intensity indicating the presence of micro air bubbles, it generates a signal that is delivered on line 39 to an interlock control circuit 14, shown as a printed circuit board in FIG. 1. Line 39 is shown as an input "R1" to the circuit 14. Inputs R2, R3, and R4 respectively represent the inputs of identical sensors 38A, 38B, and 38C that are employed to sense the resist solution flowing through other dispensing lines forming part of the coating unit 10.

Control circuit 14 processes the signals received on inputs R-1-R4, and when a signal is received on one of these inputs indicating that micro air bubbles have been sensed, an LED 56 is turned on to indicate an alarm condition, an alarm signal is issued on line 52 to the master controller 16. The master controller 16 is responsive to the alarm signal on line 52 to issue a signal on line 54 that terminates operation of the pump 40. In effect, the sensor 38 and control circuit 14 cooperate with the master controller 16 to form an air bubble interlock that precludes dispensing resist solution onto the wafer 50 whenever air bubbles are present in the resist solution drawn into the pump 40.

It should be mentioned here that the air bubble interlock described above may be conveniently retrofitted to existing dispensing systems and, in the event of a malfunction in the interlock system, it does not interfere with or adversely affect the remaining components of the dispensing system.

Figure 2:
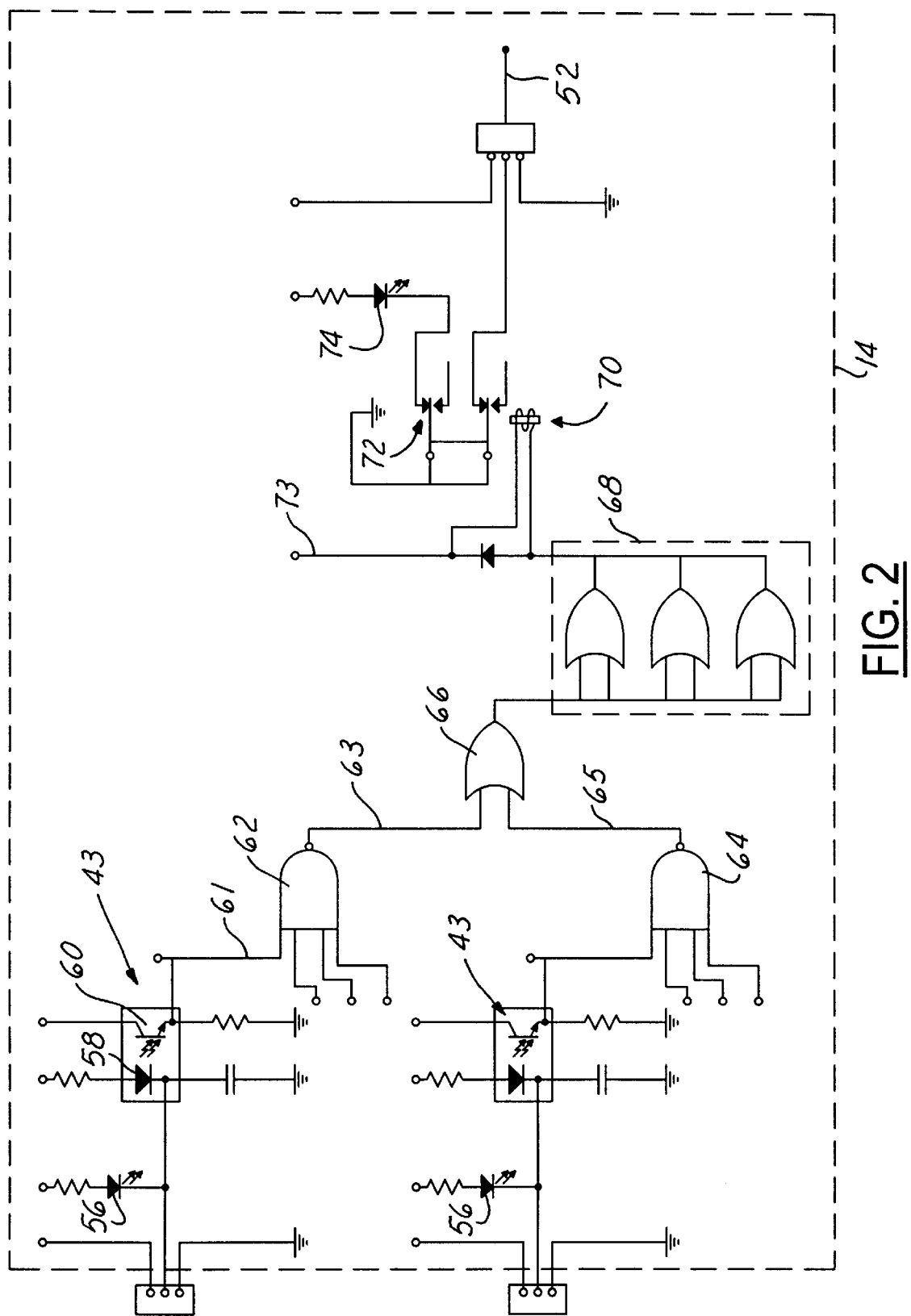

Referring now to also to FIG. 2 each of the sensors 38 comprises a source of light, such as an LED 58 and a phototransistor 60. These two latter mentioned components are mounted such that the LED 58 emits light that passes through a resist solution and is picked up by the phototransistor 60. As mentioned earlier, the presence of micro air bubbles in the solution alters the refracted index of the solution, thereby changing the intensity of light that is received by the phototransistor 60. When the change in the intensity of light exceeds a preset, threshold value, transistor 60 turns on, thereby issuing a signal on line 61 which forms one input of a multi-input NAND gate 62. The remainder of the inputs to NAND gate 62 are defined by the output lines of the sensors 38A–39C. Normally, in the absence of any micro air bubbles being sensed, inputs to the NAND gate 62 are high and its output on line 63 is low. Line 63 forms one input to NOR gate 66, a second input to NOR gate 66 being formed by line 65 which is connected to the output of NAND gate 64 associated with the second coater 12 (FIG. 1). NAND gate 64 functions identical to NAND gate 62, having its inputs connected to receive the output signals from the sensors 41 associated with the second coater 12.

Normally, lines 63 and 65 are low, consequently the output of NOR gate 66 is low. This low output from gate 66 is delivered to the inputs of three NOR gates 68 which function as a buffer to square up the signal before it is delivered to the coil 70 of a relay. Coil 70 controls a set of relay contacts 72 that selectively couple an LED 74 with a power source, and also couple a power source with the output, alarm signal line 52. When the presence of micro air bubbles is sensed by any of the sensors 38, 41 at least one of the lines 61 switches from high to low, consequently the output of the corresponding NAND gate 62 switches from low to high. This high signal is gated through NOP gates 66 and 68 and functions to couple a voltage source 73 with the relay coil 70, thereby energizing the latter. With coil 70 energized, contacts 72 are switched, thereby turning on the LED 74 and coupling line 52 with a voltage source so as to issue the alarm signal in line 52 to the master controller 16.

It may appreciated at this point that a novel method of dispensing liquid resist solution has been provided that comprises the steps of flowing the solution from a reservoir into a tank; removing at least some of the air bubbles contained in the solution within the tank; flowing the solution from the tank through a line to a dispensing nozzle; sensing the presence of air bubbles contained in the solution flowing through the line; dispensing the solution through a nozzle; and issuing a alarm signal when air bubbles are sensed before these air bubbles are dispensed as part of the solution.

From the foregoing, it is apparent that the method and apparatus described above not only provide for the reliable accomplishment of the objects of the invention, but it do so in a particularly economical and efficient manner. It is recognized, of course, that those skilled in the art may make various modifications or additions to the preferred embodiment chosen to illustrate the invention without departing from the spirit and scope of the present contribution to the art. Accordingly, it is to be understood that the protections sought and to be afforded hereby should be deemed to extend to the subject matter claimed and all equivalents thereof fairly within the scope of the invention.

What is claimed is:

1. Apparatus for dispensing liquid resist solution used in a semiconductor device manufacturing process, comprising:

a reservoir of said resist solution;

a trap tank for trapping air bubbles entrapped in said resist solution;

a first fluid line connecting said reservoir with said trap tank;

a pump for drawing said resist solution from said trap tank and dispensing said resist solution during said manufacturing process;

a second fluid line connecting said trap tank with said pump;

a sensor for sensing the presence of air bubbles in the resist solution flowing through said second line from said trap tank to said pump and producing a signal indicative of the presence of said air bubbles; and a controller coupled with said sensor for controlling the operation of said process in accordance with said signal produced by said sensor.

2. The dispensing apparatus of claim 1, wherein said sensor includes:

a light source for directing light through said resist solution, and a photosensitive detection element for detecting changes in the light passing through said resist solution and originating from said light source.

3. The dispensing apparatus of claim 1, wherein said sensor is coupled with said second line for sensing air bubbles in said second line.

4. The dispensing apparatus of claim 1, wherein said controller includes an annunciator for annunciating an alarm condition, and a circuit for controlling said annunciator in accordance with the signals produced by said sensor.

5. The dispensing apparatus of claim 1, wherein said annunciator is a light emitting diode.

6. The dispensing apparatus if claim 1, including:

a nozzle for dispensing said resist solution;

a third fluid line connecting said nozzle; and a filter in said third line for filtering said resist solution prior to dispensing thereof through said nozzle.

7. The dispensing apparatus of claim 1, wherein said sensor includes an optical photocoupler for passing light through said resist solution and sensing changes in the intensity of light refracted through said solution, the sensed changes in said intensity being related to the presence of air bubbles in said resist solution.

8. For use in a semiconductor device manufacturing operation of the type having a plurality of processing stations for processing semiconductor wafers, each of said stations including a source of liquid resist solution, a trap tank for removing air bubbles entrapped in said solution, a nozzle for dispensing said solution and a pump for drawing said solution from said tank through said nozzle, apparatus for monitoring the presence of air bubbles in the solution drawn from said tank to said pump, comprising;

a plurality of sensors for respectively detecting the presence of air bubbles in the resist solution drawn from the associated tank to the corresponding tank, each of said sensors producing a signal indicative of the presence of air bubbles in said resist solution; and, a circuit connected with each of said sensors for receiving the signals produced by said sensors and for generating an alarm signal when said circuit receives a signals from any of said sensors.

9. The monitoring apparatus of claim 8, wherein said circuit includes:

a logic circuit having a plurality of inputs for receiving said sensor signals and an output for delivering a trigger signal, and a switch actuatable by said trigger signal for outputting said alarm signal.

10. The monitoring apparatus of claim 8, wherein each of said sensors includes an optical photocoupler for passing light through said resist solution and sensing changes in the intensity of light refracted through said solution, the sensed changes in said intensity being related to the presence of air bubbles in said resist solution.

11. The monitoring apparatus of claim 9, wherein said switch is defined by an electrical relay.

12. The monitoring apparatus of claim 9, wherein said circuit includes a buffer connected between said logic circuit and said switch.

13. A method of dispensing liquid resist solution used in a process for manufacturing semiconductor devices, comprising the steps of:

(A) flowing said solution from a reservoir thereof into a tank;

(B) removing at least some of the air bubbles contained in said solution contained within said tank;

(C) flowing said solution from said tank through a line to a dispensing nozzle;

(D) sensing the presence of air bubbles contained in the solution flowing through said line in step (C);

(E) dispensing said solution through said nozzle; and, (F) issuing an alarm signal when air bubbles are sensed in step (D).

14. The method of claim 13, including the steps of:

(G) flowing said solution from said tank to a dispensing pump; and (H) controlling said pump in response to the issuance of said alarm signal.

15. The method of claim 13, wherein step (D) is performed by passing light through the solution flowing through said line, and sensing changes in the intensity of light passing through said solution the change in said intensity being indicative of the presence of air bubbles in said solution.

16. A method of dispensing liquid resist solution a plurality of semiconductor manufacturing stations, comprising the steps of:

(A) flowing said solution from a reservoir at each of said stations into a tank at the station;

(B) removing at least some of the air bubbles entrapped in said solution while said solution is in said tank;

(C) flowing said solution from said tank to a dispensing pump at said station;

(D) sensing the presence of air bubbles in the solution flowing from each of the tanks to the associated pump; and, (E) issuing an alarm when the presence of air bubbles is sensed in step (D) at any of said stations.

17. The method of claim 16, including the steps of:

(F) generating signals when air bubbles are sensed in step (D) at any of said stations; and (G) gating said signals through a logic circuit.

18. The method of claim 17, including the steps of:

(H) producing a trigger signal using the signals gated in step (G); and (I) actuating an alarm relay using the trigger signal produced in step (H).

* * * * *